United States Patent [19]

Takemae et al.

[11] 4,409,677

[45] Oct. 11, 1983

[54] SEMICONDUCTOR INTEGRATED CIRCUIT DEVICE

[75] Inventors: Yoshihiro Takemae, Yokohama; Masao Nakano, Kawasaki, both of Japan

[73] Assignee: Fujitsu Limited, Kawasaki, Japan

[21] Appl. No.: 103,925

[22] Filed: Dec. 17, 1979

[30] Foreign Application Priority Data

Dec. 23, 1978 [JP] Japan .................................. 53-161648
Dec. 23, 1978 [JP] Japan .................................. 53-161649

[51] Int. Cl.³ .............................................. G11C 7/02
[52] U.S. Cl. ................................ 365/206; 307/296 R; 307/542; 365/226
[58] Field of Search ............................ 365/206, 226; 307/296 R, 297, 520, 542, 543, 546, 562

[56] References Cited

U.S. PATENT DOCUMENTS

3,387,222  6/1968  Hellwarther et al. ............... 365/206
3,978,348  8/1976  Henninger et al. .................. 307/543
4,031,523  6/1977  Horsten ................................ 365/206

Primary Examiner—Stuart N. Hecker
Attorney, Agent, or Firm—Staas & Halsey

[57] ABSTRACT

A semiconductor integrated circuit device includes a circuit for supplying a reference voltage which is generated in a reference voltage generator circuit to plural load circuits. A plurality of noise limiters have one end commonly connected to the output of the reference voltage generator and another end respectively connected to a corresponding load circuit. The value of the impedance of the noise limiters is of the same order or larger than the output impedance of the reference voltage generator circuit, and capacitors for eliminating the noise may be provided between each noise limiter and each load circuit.

15 Claims, 10 Drawing Figures

SEMICONDUCTOR INTEGRATED CIRCUIT DEVICE

BACKGROUND OF THE INVENTION

The present invention relates to a circuit construction for decreasing a malfunction due to noise in an electronic circuit, such as a semiconductor memory device, which electric circuit comprises a semiconductor integrated circuit and which is used in an electronic device, such as a computer.

DESCRIPTION OF THE PRIOR ART

Recently, the semiconductor memory device which uses MOS (Metal-Oxide-Semiconductor) field effect semiconductor devices, a so called MOS memory device, is frequently used. The MOS memory device is formed by using a plurality of memory cells, X and Y address decoders for selecting the memory cells and sense amplifiers etc, and a TTL (Transistor-Transistor Logic) circuit is used for controlling or driving the MOS memory device. However, the amplitude of the logic level of the TTL circuit is smaller than the amplitude of the logic level in the MOS memory device. Therefore, a circuit having a high sensitivity should be used as the input circuit of the MOS memory device, and at present, a flip-flop circuit is frequently used.

When the flip-flop circuit is used as the input circuit of the MOS memory device, one input terminal of the flip-flop circuit is connected to the output of the TTL circuit and another input terminal of the flip-flop circuit receives the reference voltage, and a logical value "1" or "0" is generated at the output of the flip-flop circuit in accordance with whether the output of the TTL circuit is larger or smaller than the reference voltage. Usually, about 1.5 volts [V], which is an intermediate value between 2.5–3.5 [V] and 0.4–0.8 [V] corresponding to the values "1" and "0" of the TTL circuit, is used as the value of the reference voltage; therefore, the value of the reference voltage should be kept at a constant value regardless of noise or voltage variation caused in a load circuit.

However, for the purpose of economizing on electric power dissipation, the reference voltage generator circuit included in the MOS memory device is obliged to have a large output impedance. Therefore, in the flip-flop circuit, the reference voltage is varied in accordance with the potential level change when the clock pulse signal is supplied and the flip-flop circuit is operated.

Therefore, for the purpose of removing the above-mentioned drawbacks, conventionally, the reference voltage generator circuits are provided independently to each load circuit. This prior art can remove the above-mentioned drawback, however, the circuit requires a large size and is complicated and the increase of the electrical power dissipation cannot be avoided. Further, the noise elimination circuit for example, an opposite phase noise generator circuit, is conventionally used. This noise elimination circuit generates the opposite phase noise signal, so as to cancel the noise by superposition. However, the technique for timely generating the opposite phase noise and for timely superposing the opposite phase noise to the noise is very difficult, and the circuit or the adjust means for carrying out the same is complex and troublesome.

SUMMARY OF THE INVENTION

An object of the present invention is to provide a semiconductor integrated circuit device, including voltage stabilizing circuits, which stabilizing circuits keep the value of a reference voltage at a constant value, regardless of the noise and the voltage variation caused by a load circuit in the circuit for supplying the reference voltage generated in the reference voltage generator circuit to a plurality of the load circuits.

Another object of the present invention is to provide a semiconductor integrated circuit device, including voltage stabilizing circuits, which stabilizing circuits can prevent the influence of the noise caused in one load circuit where the reference voltage is supplied from the reference voltage generator circuit to another load circuit by using very simple circuits.

The above-mentioned objects can be achieved by a semiconductor integrated circuit device including a circuit for supplying a reference voltage which is generated in a reference voltage generator circuit to load circuit, said supplying circuit comprising a plurality of noise limiters which have one end commonly connected to the output of the reference voltage generator and which have another end respectively connected to a corresponding load circuit, and the value of the impedance of the noise limiters being of the same order or larger than the output impedance of the reference voltage generator circuit, and capacitors for eliminating the noise may be provided between each noise limiter and load circuit.

Further features and advantages of the present invention will be apparent from the ensuing description with reference to the accompanying drawings to which, however, the scope of the invention is in no way limited.

DETAILED DESCRIPTION OF THE INVENTION

Figure 1:
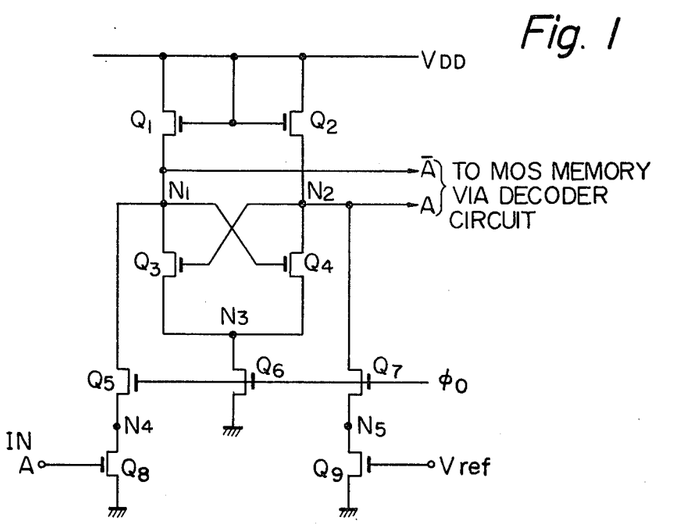
FIG. 1 illustrates one example of a flip-flop circuit which is used in the MOS memory device.

FIG. 1 illustrates a flip-flop circuit provided in the MOS memory device for transforming the amplitude level in the TTL circuit to the amplitude level for the MOS memory device. The circuit shown in FIG. 1 is formed, for example, having nine MOS field effect transistors (MOS FFTs) $Q_1$ through $Q_9$. In the flip-flop circuit shown in FIG. 1, one input terminal IN receives the output (for example, the output A) of another TTL circuit (not shown in FIG. 1) which belongs to another MOS memory device for controlling the MOS memory device, such as an address driver, another input terminal $V_{ref}$ receives the reference voltage from the reference voltage generater circuit, and, based on the reference voltage, the flip-flop circuit judges whether the input of the flip-flop circuit is "0" or "1". That is, when the input A of the flip-flop circuit is "1" (or "0"), the output $\overline{A}$ which corresponds to the "1" (or "0") signal and the output A which corresponds to the "0" (or "1") signal is generated at the output of the flip-flop circuit. Usually, about 1.5 [V] which is about an intermediate value between 2.5–3.5 [V] and 0.4–0.8 [V] corresponding to the value "1" and "0" of the TTL circuit is used as the reference voltage. Therefore, the value of the reference voltage should be kept at a constant value, regardless of the noise or the voltage variation caused in a load circuit.

However, for the purpose of economizing on electric power dissipation, the reference voltage generator circuit included in the MOS memory device is obliged to have a large output impedance. Therefore, in the load circuit, such as the flip-flop circuit shown in FIG. 1, when the clock pulse signal $\phi_0$ which is generated in the clock pulse signal generator included in the MOS memory device in accordance with the control signal supplied from the external control circuit is applied to the flip-flop circuit and the flip-flop circuit is operated, the voltage level at a node point $N_5$ effects the reference voltage via a capacitance (not shown) between the gate and the drain of the MOS field effect transistor $Q_9$ so as to change the voltage level of the reference voltage.

Figure 2:
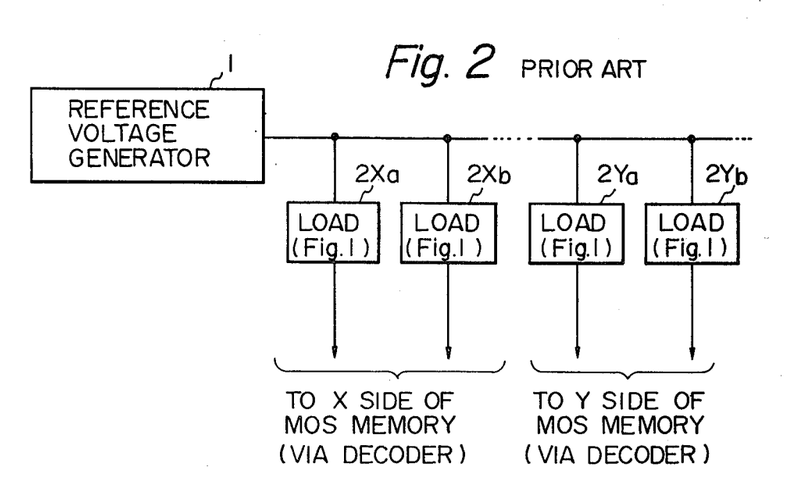
FIGS. 2, 3 and 4 are block diagrams illustrating a connection between a reference voltage generator circuit and load circuits which are conventionally used.

On the other hand, conventionally, as shown in FIG. 2, the reference voltage is generated in a single reference voltage generator 1, and the generated reference voltage is branched to a plurality of load circuits (flip-flop circuits) 2Xa, 2Xb, . . . ; 2Ya, 2Yb, . . . , and the outputs of these load circuits are respectively supplied to X and Y address decoders in the MOS memory device. Usually, in the MOS memory device, the operation times of the X side load circuits 2XA, 2Xb, . . . and of the Y side load circuits 2Ya, 2Yb, . . . are frequently different, and the magnitude of the various noise caused in the load circuits is also different. For example, in an address multiplexed memory device, the flip-flop circuit shown in FIG. 1 is used as an address buffer circuit for controlling the address decoder or an input buffer circuit, and therefore, these load circuits are frequently operated at different times. Therefore, when for example, the load circuit 2Xa is operated and noise is caused therein and the load circuit 2Ya or 2Yb is operated before the effect due to the noise has disappeared, the load circuit 2Ya or 2Yb is operated with an incorrect reference voltage so that these load circuits 2Ya or 2Yb malfunction.

Figure 3:
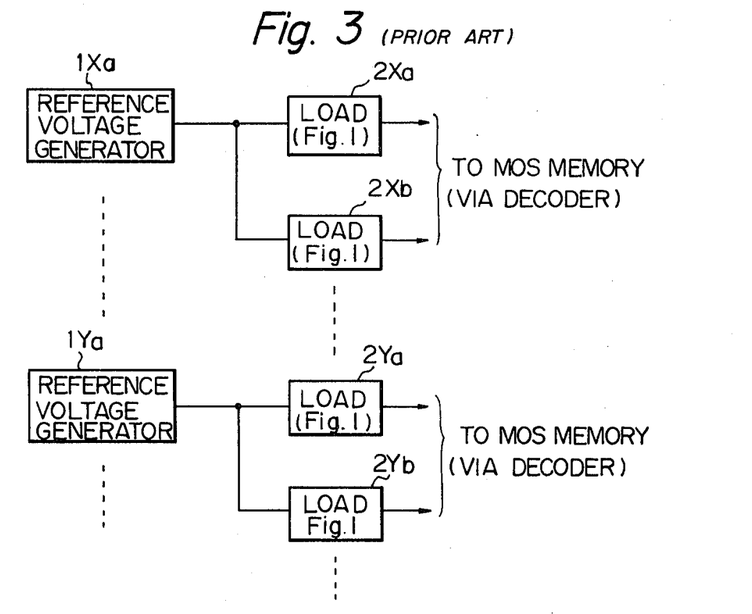
Figure 4:
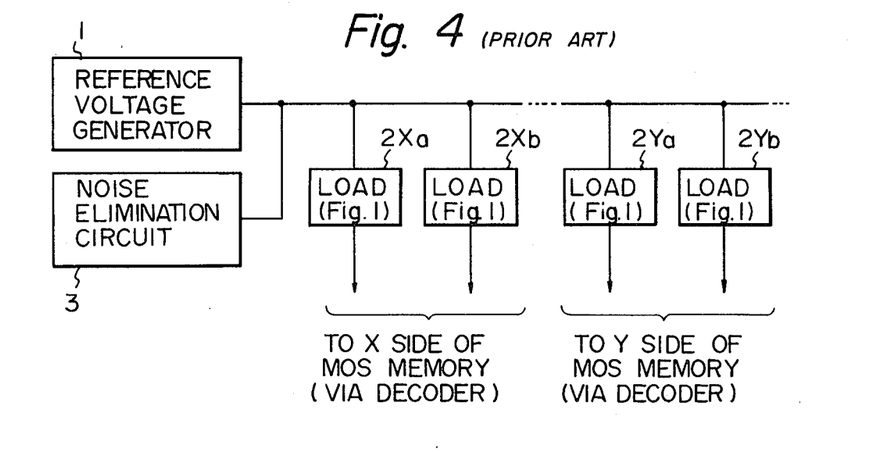

Therefore, for the purpose of removing the above-mentioned drawbacks, conventionally, the reference voltage generator circuits 1Xa, . . . ; 1Ya, . . . are provided independently to each load circuit 2Xa, 2Xb, . . . ; 2Ya, 2Yb, . . . , as shown in FIG. 3. The circuit shown in FIG. 3 can remove the above-mentioned drawback, however, the circuit requires a large size and is complicated and the increase of electrical power dissipation cannot be avoided. Further, the noise elimination circuit 3 for example, an opposite phase noise generator circuit, is conventionally used as shown in FIG. 4. This noise elimination circuit generates an opposite phase noise signal, so as to cancel the noise by superposing the same. However, the technique for timely generating the opposite phase noise and for timely superposing the opposite phase noise to the noise is very difficult, and the circuit or the adjust means for carrying out the same is complex and troublesome.

Next, we will explain in detail the embodiments of the present invention.

Figure 5:
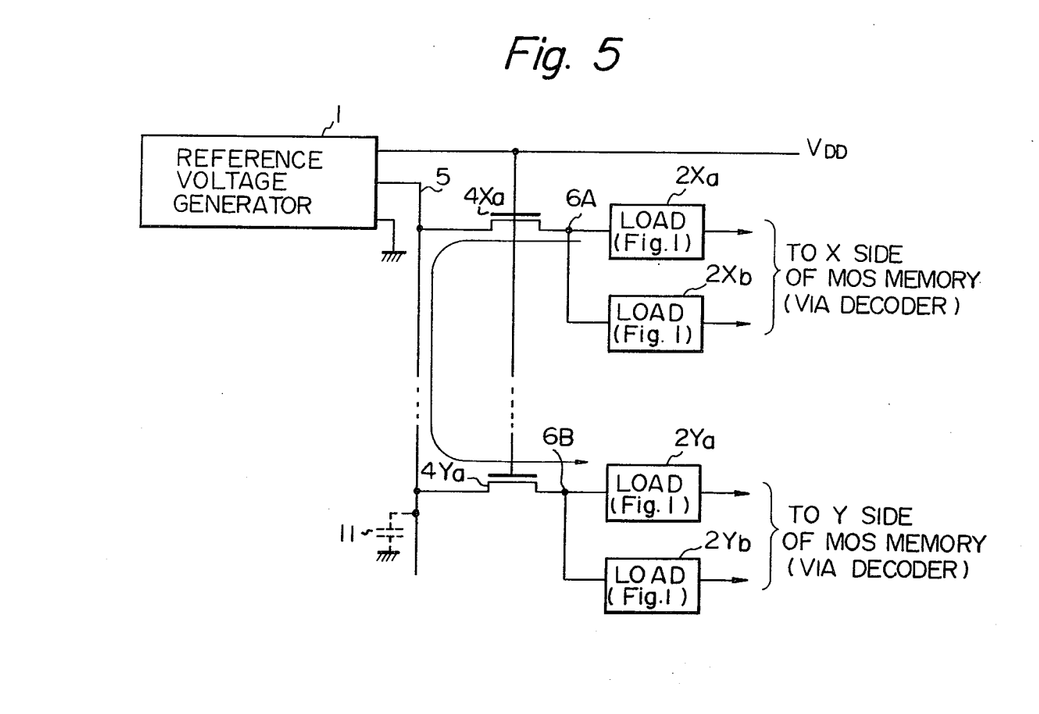
FIG. 5 illustrates a block diagram of a first embodiment of a voltage stabilizing circuit which is used in the present invention.

FIG. 5 is a block diagram of one embodiment of the present invention. Referring to FIG. 5, the symbols which are used in the previous drawings designate the same portions as in the previous drawings.

In FIG. 5, the difference between the embodiment of the present invention and the prior art is to provide independent noise limiters 4Xa, . . . ; 4Ya, . . . having an impedance of the same order as or larger than, the output impedance of the reference voltage generator circuit 1 between the reference voltage generator circuit 1 and the load circuits 2Xa, 2Xb, . . . and between the reference voltage generator circuit 1 and the load circuits 2Ya, 2Yb, . . . . In FIG. 5, the load circuit 2Xa, 2Xb, . . . ; 2Ya, 2Yb, . . . are, as already mentioned, flip-flop circuits, and are used as the address buffer circuits for controlling X-address decoder circuits and Y address decoder circuits in the MOS memory device.

As shown in FIG. 5, the MOS field effect transistors 4Xa and 4Ya which are formed as a low conductance Gm element so as to provide a high impedance by using a long gate length (the distance between the source and the drain) can be used as the noise limiter elements. Further, a resistance element which is formed by diffusion of an impurity into a semiconductor substrate, or a resistance element which is formed as a thin film in accordance with a usual process for manufacturing a thin film, can be also used as the noise limiter for the purpose of suppressing the noise. The noise limiter elements are arranged near the reference voltage generator circuit in the MOS memory device chip.

Now, assuming that the noise is caused by the operation of the load circuit 2Xa, and the load circuit 2Ya is operated before the noise caused in the load circuit 2Xa disappears, the noise caused in the load circuit 2Xa is applied to the load circuit 2Ya via a path which is shown by the arrow in FIG. 5. However, the noise must pass the two noise limiters 4Xa, 4Ya from the load circuit 2Xa to the load circuit 2Ya, 2Yb, so that the noise is greatly suppressed. Further, in the present invention, as the noise limiters have an output impedance larger than or the same as the output impedance of the reference voltage generator circuit 1, if the noise caused when, for example, the load circuit 2Xa is operated is $\Delta V[V]$ at a node point 6A, the noise voltage $\Delta V_n$ appearing at a node point 5 at the output terminal of the reference voltage generator circuit is expressed in the following equation:

$$\Delta V_n = \frac{Z_1}{Z_1 + Z_2} \Delta V \leq \tfrac{1}{2} \Delta V \, [V],$$

because, when the output impedance of the reference voltage generator circuit 1 is denoted by $Z_1$, and the output impedance of the noise limiters by $Z_2$, the impedance $Z_2$ is at least equal to the impedance $Z_1$, that is $Z_1 \leq Z_2$.

Therefore, when the value of the impedance $Z_2$ further increases, the value of the noise voltage appearing at a node point 5 further decreases. When the output voltage (reference voltage) of the reference voltage generator circuit 1 is kept at a constant value, the noise caused a a node point 6A is hardly transmitted to a node point 6B, so that a malfunction in the load circuit 2Ya or 2Yb can be prevented.

Figure 6:
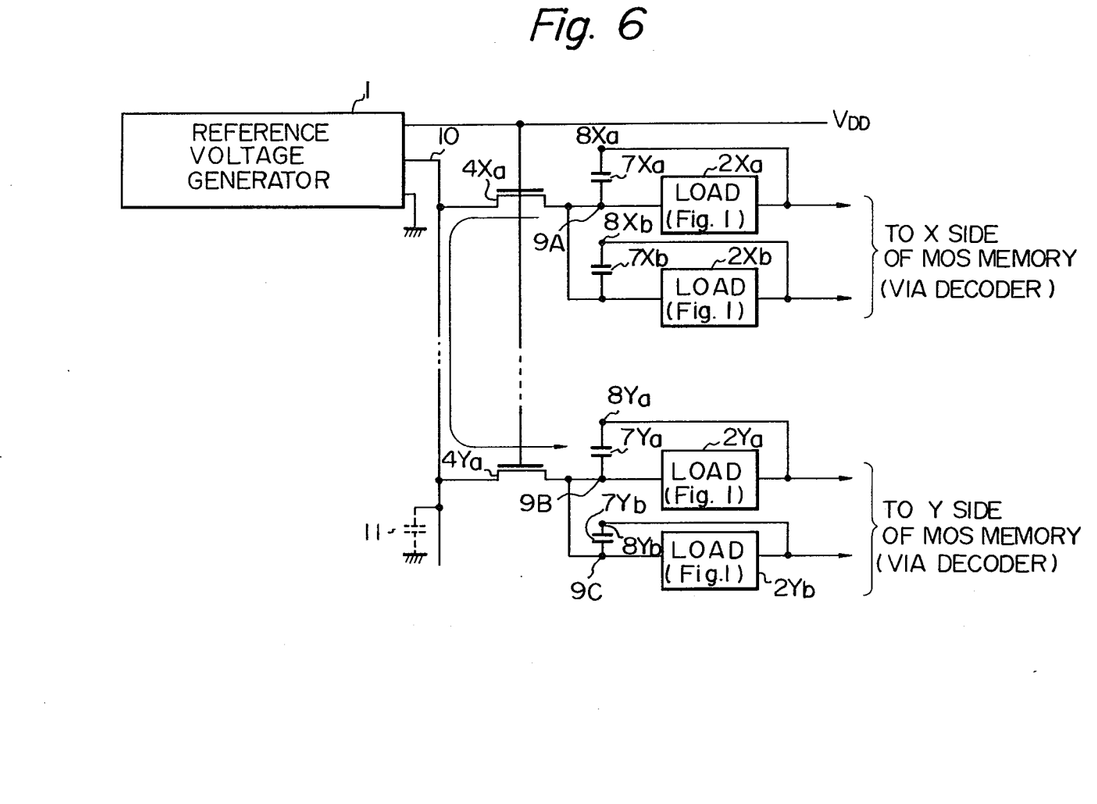
FIG. 6 illustrates a block diagram of a second embodiment of a voltage stabilizing circuit which is used in the present invention.

FIG. 6 illustrates a block diagram of another embodiment of the present invention, and the same symbols as those in the previous drawings illustrate the same portions as in the previous drawings.

Characteristic features of the embodiment shown in FIG. 6 are the provision of noise limiters 4Xa, ...; 4Ya, ... and capacitance elements 7Xa, 7Xb, ...; 7Ya, 7Yb, ... which are independently inserted between the reference voltage generator circuit 1 and the load circuits 2Xa, 2Xb, ...; 2Ya, 2Yb, .... The noise limiters 4Xa, ...; 4Ya, ... are formed by a element having impedance, as already mentioned, and a MOS field effect transistor or a resistor which is formed by the impurity diffusion can be used as the noise limiter. Of course, in the embodiment shown in FIG. 6, the noise limiters have impedance equal to or larger than the output impedance of the reference voltage generator circuit 1. The capacitance elements are formed by so-called MOS capacitors which are formed by using a gate film as a dielectric, a gate electrode as one electrode and a common connection of a source and a drain as another electrode. As hereafter mentioned, the signal having an opposite phase to the noise is applied to terminals 8Xa, 8Xb ...; 8Ya, 8Yb, ... in coordination with the noise, so as to cancel the noise. The MOS capacitors are used as the capacitance of elements, the capacitance elements 7Xa, 7Xb, ...; 7Ya, 7Yb, ... having a capacitance of about 0.01 pF.

Figure 7:
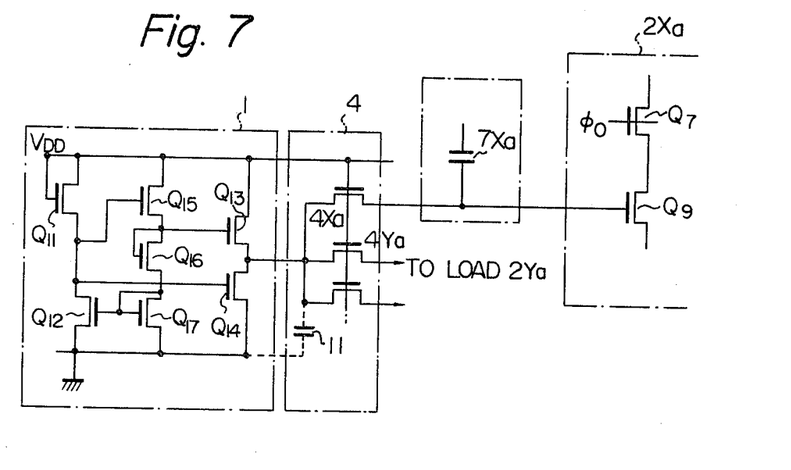
FIG. 7 illustrates a detailed connection diagram of the embodiment shown in FIG. 6.

A detailed circuit of the block diagram shown in FIG. 6 is illustrated in FIG. 7. In FIG. 7, a detailed circuit of the reference voltage generator circuit 1, the noise limiter 4, the capacitance element 7Xa and the load circuit 2Xa is illustrated. As shown in FIG. 7, the reference voltage generator circuit 1 is formed by including MOS field effect transistors $Q_{11}$, $Q_{12}$ which are used for dividing the electric source voltage $V_{DD}$, MOS field effect transistors $Q_{13}$, $Q_{14}$ which are used for amplifying the voltage divided by the MOS field effect transistors $Q_{11}$, $Q_{12}$, and MOS field effect transistors $Q_{15}$, $Q_{16}$, $Q_{17}$ which are used for supplying suitable bias voltages to these MOS field effect transistors $Q_{11}$, $Q_{12}$, $Q_{13}$ and $Q_{14}$. These MOS field effect transistors for forming the reference voltage generator circuit, noise limiter elements and MOS field effect transistors used as the flip-flop circuits are formed in the MOS memory device. Further, in FIG. 7, the capacitance element 11 in the noise limiter 4 is a stray capacitance of about 10 pF between the output terminal of reference voltage generator circuit 1 and the ground.

Figure 8:
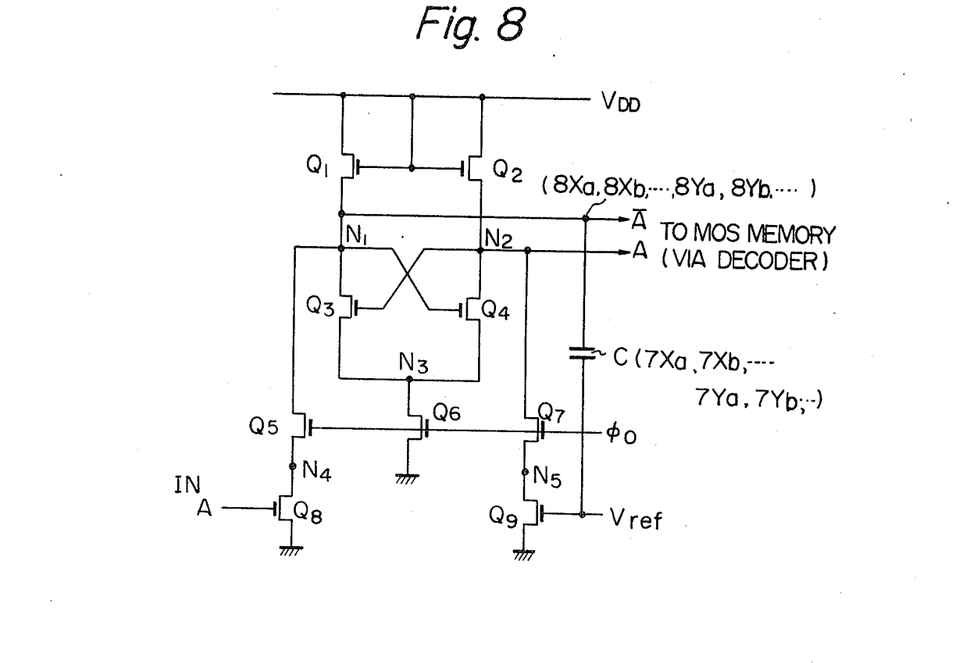
FIG. 8 illustrates a connection diagram of one example of the load circuit shown in FIG. 7.

One example of the capacitance element 7Xa and the load circuit 2Xa is shown in FIG. 8. Referring to the circuit shown in FIG. 8, the voltage appearing at a node point $N_1$, that is, at one output terminal of the flip-flop circuit, has an opposite polarity to the noise applied to the MOS field effect transistor $Q_9$ which receives the reference voltage $V_{ref}$. Therefore, when the node point $N_1$ is connected via a capacitance C to a gate of the MOS field effect transistor $Q_9$, the signal at the node point $N_1$ is supplied to the gate of the MOS field effect transistor $Q_9$ at the same time as the noise, so that the noise can be cancelled. Referring to FIG. 8, the symbols, except the capacitance element C, illustrate the same portions as denoted by the same symbols in FIG. 1.

Figure 9:
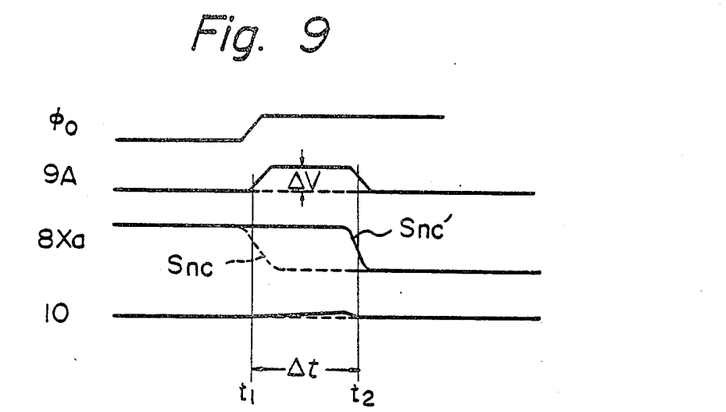
FIG. 9 illustrates diagrams showing the variation of the voltage level at various points in the connection diagram shown in FIGS. 6 and 8.

FIG. 9 illustrates waveforms which appear at the node points 9A, 8Xa, and 10 in FIG. 6.

Now, we will explain the operation of the circuit of FIG. 6 referring to the waveforms shown in FIG. 9.

Assume that the load circuit 2Xa is placed in the operating condition at the time $t_1$, by appling a clock pulse signal $\phi_0$, and a noise $\Delta V$ is caused at node 9A, and further assume that the load circuit 2Ya is placed in the operating condition before the noise $\Delta V$ disappears. Then the noise $\Delta V$ is applied to the load circuit 2Ya via the path shown by the arrow in FIG. 6. However, in the path from the node 9A to the load circuit 2Ya, the noise must pass two noise limiters 4Xa and 4Ya, so that the noise is suppressed considerably.

Furher, the signal having the opposite phase to the noise may be supplied to the node point 8Xa at the same time, and this signal is transmitted via the capacitance element 7Xa to the node point 9A, so that the noise at the node point 9A can be cancelled and hardly any variation of the voltage potential appears at the output terminal of the reference voltage generator circuit 1. Thus, for example, clock signal for operating the load circuit 2Xa, for example a signal which is synchronized with the clock signal $\phi_0$ in the flip-flop circuit shown in FIG. 1, can also be used as the noise elimination signal applied to the node point 8Xa instead of the output signal of the load circuit 2Xa.

At this time, even if the noise elimination signal Snc applied to the node point X8a is delayed a time $\Delta t$ and is applied as Snc' to the node point 8Xa at a time $t_2$ after the time $t_1$, if the time constant determined by the impedance of the noise limiter 4Xa and the stray capacitance 11 has a sufficiently large value, the noise in the node point 9A is eliminated by the noise elimination signal Snc' applied via the capacitance element 7Xa before the noise at the node point 9A reaches to the node point 10, so that the voltage variation caused at the node point is very little. Therefore, if necessary, the stray capacitance 11 may be replaced by a capacitance element having a large capacitance value.

As mentioned above, the output voltage (the reference voltage level) can be kept at a constant value, so that the noise caused at the node point 9A hardly affects the node points 9B or 9C, and the malfunction of the load circuits 2Ya or 2Yb can be prevented.

Figure 10:
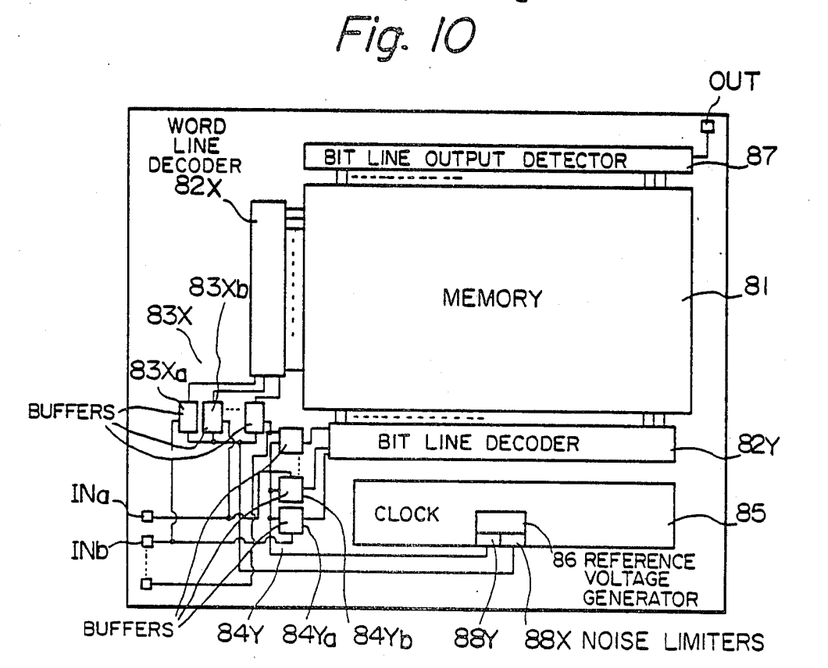
FIG. 10 illustrates one example of the circuit arrangement in one MOS memory device.

The relation of the reference voltage generator circuit, load circuits and memory cell arrays shown in FIGS. 5 through 8 is shown in FIG. 10. FIG. 10 is an outline of the circuit arrangement in one MOS memory device. Referring to FIG. 10, 81 illustrates a memory cell array including a plurality of memory cells formed by, for example, one capacitor and one transfer gate, 82-Y and 82y illustrate an X-address decoder and a Y address decoder, respectively, for the memory cell array 81, 83Xa, 83Xb, ... illustrate X-address buffer circuits formed by flip-flop circuits, and 84Ya, 84Yb, ... illustrate Y-address buffer circuits formed by flip-flop circuits. Further, reference numeral 85 illustrates a clock pulse generator circuit for generating the clock pulse signal used in the MOS memory device, the reference voltage generator circuit 86 is provided in a part of the clock pulse generator circuit 85, and 87 illustrates an output circuit including a sense amplifier circuit.

In the circuit arrangement shown in FIG. 10, the output of the reference voltage generator circuit 86 is supplied via two noise limiters 88A and 88Y to the X address buffer circuits 83Xa, 83Xb, . . . and the Y-address buffer circuits 84Ya, 84Yb, . . . . The reference voltage input terminals of the X-address buffer circuits 83Xa, 83Xb, . . . , are commonly connected as a common input terminal and the reference voltage is supplied via the noise limiter 88X to this common input terminal of the X-address buffer circuits. Similarly, input terminals of the Y-address buffer circuits 84Ya, and 84Yb, . . . are commonly connected as a common input terminal, and the reference voltage is supplied via the noise limiter 88Y to the common input terminal of the Y-address buffer circuits. Further, the outputs of the X-address buffer circuits 83Xa, 83Xb, . . . are applied to the X-address decoder 82X, and the output of the Y-address buffer circuits 84Ya, 84Yb, . . . are applied to the Y-address decoder 82Y, and INa illustrates an input terminal for the X-address buffer circuit 83Xa and the Y-address buffer circuit 84Ya and INb illustrates an input terminal for the X-address buffer circuit 83Xb and the Y-address buffer circuit 84Yb.

The output terminals of the X-address decoder 82X are connected to word lines in the memory cell array and the output terminals of the Y-address decoder 82Y are connected to bit lines in the memory cell array. The output circuit 87 detects the information appearing in the bit lines of the memory cell array and outputs the information via a terminal OUT of the output circuit 87.

In the MOS memory device shown in FIG. 10, we assume that, for the purpose of selecting a specified memory cell, first the X-address (word line) is selected and next the Y-address (bit line) is selected. In this case, if the noise is caused in the circuit for selecting an X-address, said noise is introduced to the circuit for selecting a Y-address via the noise limiters 88X and 88Y, therefore, the noise is attenuated so that the malfunction of the circuit for selecting the Y-address can be prevented. Further, if the noise elimination capacitance elements are inserted in the input terminal of the reference voltage in each address buffer circuit, as shown in FIGS. 6 and 8 (not shown in FIG. 10), the malfunction can be more effectively prevented.

Further, in the MOS memory device according to the present invention, a so-called page mode operation, that is, the operation for reading out the information from bit lines by continuously switching the bit lines while the specified word line is kept in a selected and fixed state, is frequently carried out. In this page mode operation, the circuits for selecting a Y-address, including the address buffer circuits 84Ya, 84Yb, . . . is operated at the same time as the respective address buffer for the selected word line, so that the noise is not caused among the address buffer circuits 84Ya, 84Yb, . . . , and therefore, it is not necessary to provide a noise limiter at every address buffer circuit 84Ya, 84Yb, . . . .

As mentioned above, in accordance with the present invention, the noise caused in a load circuit can be effectively suppressed by using a very simple circuit construction, so that the reference voltage applied to a highly sensitive input circuit, such as in an MOS memory device, can be easily stabilized. Further, since a high resistance element may be used as the noise limiter element, the increase of the electric power dissipation due to the utilization of the noise limiter is very little. Further, complex adjustment of the timing for suppressing the noise is not necessary; therefore the circuit construction can be simplified, and the formation of the pattern when the MOS memory device is formed by the integrated circuit is very advantageous.

What is claimed is:

1. A semiconductor integrated circuit device including a semiconductor portion, a constant voltage reference circuit to generate a constant reference voltage and at least two load circuits which receive said constant reference voltage, said device comprising:
    at least two noise limiters, each having two terminals, a first of said two terminals of each said noise limiter being commonly connected to the output terminal of said constant voltage reference circuit, the second one of said two terminals of the first one of said noise limiters being connected to at least a first one of said load circuits, the second one of said two terminals of a second one of said noise limiters being connected to at least a second one of said load circuits, and the impedance of each said noise limiter being at least approximately as large as the output impedance of said constant voltage reference circuit;
    wherein all of the load circuits connected to said second terminal of each said noise limiter are operated at a respective time that is different from the time of operating each load circuit connected to the second terminal of each other of said noise limiters; and
    wherein a noise signal that appears at said input of each one of said load circuits connected to one of said noise limiters, associated with the operation of one of these load circuits, is suppressed from effecting the value of said constant reference voltage that is applied to the inputs of each of said load circuits connected to the other noise limiters.

2. The device of claim 1 comprising capacitor elements for cancelling said noise signal appearing at the inputs of said load circuits, each said capacitor element having a first terminal connected to the second terminal of the respective noise limiter.

3. The device of claim 2, each said capacitor element comprising a MOS type capacitance element.

4. The device of claim 2, each said load circuit having at least one output terminal, wherein the second terminal of each said capacitor element is connected to a selected output terminal of the respective load circuit.

5. The device of claim 2, each said load circuit comprising means for generating a superposition signal corresponding to a respective noise signal associated with the operation of the respective load circuit, said superposition signal comprising opposite phase from said respective noise signal, wherein said capacitor elements each have a second terminal which receives the superposition signal for cancellation with said respective noise signal at said first terminal of the capacitor element.

6. The device of claim 1, wherein said semiconductor integrated circuit device comprises a MOS memory device connected to receive signals corresponding to the outputs of the load circuits.

7. The device of claim 1, wherein said load circuits comprise flip-flop circuits formed with MOS field effect transistors.

8. The device of claim 7, wherein each said flip-flop circuit converts a TTL level signal into a MOS level signal.

9. The device of claim 7 comprising a MOS memory circuit and an address decoder circuit for operating said MOS memory circuit, and the outputs of said load circuits being connected to the respective decoder circuits.

10. The device of claim 1 or 2, each said noise limiter comprising a drain-source resistance of a respective low conductance MOS field effect transistor.

11. The device of claim 1 or 2, each said noise limiter comprising a resistance element comprising a diffused impurity material in a part of said semiconductor portion for providing said impedance of the noise limiter.

12. A semiconductor integrated circuit device according to claim 1 or 2, wherein each said noise limiter comprises a film resistance element.

13. The device of claim 1, 2 or 6, wherein said constant voltage reference circuit comprises a MOS field effect transistor circuit.

14. The device of claim 1, 2, 6, 3, 4, 5, 7 or 9, wherein said output of said constant voltage rererence circuit is formed so as to provide a stray capacitance between the output of said constant voltage reference circuit and ground.

15. The device of claim 1 or 2 wherein each said load circuit compares said constant reference voltage to a respective input signal having a respective timing, to determine whether each respective input signal is larger or smaller than said constant reference voltage.

* * * * *

UNITED STATES PATENT AND TRADEMARK OFFICE
CERTIFICATE OF CORRECTION

PATENT NO. : 4,409,677

DATED : 11 October 1983

INVENTOR(S) : Takemae et al

It is certified that error appears in the above-identified patent and that said Letters Patent is hereby corrected as shown below:

Col. 2, line 22, "circuit" (first occurrence) should be -- circuits--.

Col. 3, line 6, "generater" should be --generator--;
line 9, "A" should be --A--;
line 11, "A" should be --Ā--;
line 42, "2XA" should be --2Xa--.

Col. 4, line 16, "as" should be --as,--;
line 21, "circuit" should be --circuits--.

Col. 5, line 16, "a" should be --an--;
line 54, after "of" insert --the--;
line 55, delete "the".

line 55, "82-Y" should be --82-X--;
line 68, "88A" should be --88X--.

Col. 10, line 5, "rererence" should be --reference--.

Signed and Sealed this

Twenty-sixth Day of June 1984

[SEAL]

Attest:

GERALD J. MOSSINGHOFF

Attesting Officer    Commissioner of Patents and Trademarks